US012581798B2

(12) United States Patent
Oh

(10) Patent No.: US 12,581,798 B2
(45) Date of Patent: Mar. 17, 2026

(54) DISPLAY DEVICE

(71) Applicant: LG Display Co., Ltd., Seoul (KR)

(72) Inventor: Yeonjun Oh, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 461 days.

(21) Appl. No.: 18/079,747

(22) Filed: Dec. 12, 2022

(65) Prior Publication Data

US 2023/0217682 A1     Jul. 6, 2023

(30) Foreign Application Priority Data

Dec. 30, 2021     (KR) ........................ 10-2021-0193148

(51) Int. Cl.
| | |
|---|---|
| *H10K 50/84* | (2023.01) |
| *H10K 50/844* | (2023.01) |
| *H10K 50/86* | (2023.01) |
| *H10K 59/124* | (2023.01) |
| *H10K 59/131* | (2023.01) |
| *H10K 77/10* | (2023.01) |

(52) U.S. Cl.
CPC ......... *H10K 50/841* (2023.02); *H10K 50/844* (2023.02); *H10K 50/86* (2023.02);
(Continued)

(58) Field of Classification Search
CPC .... H10K 50/841; H10K 50/844; H10K 50/86; H10K 59/124; H10K 59/131;
(Continued)

(56) References Cited

U.S. PATENT DOCUMENTS

| | | | | |
|---|---|---|---|---|
| 11,398,611 B2 * | 7/2022 | Jeon | ....................... | H10K 59/40 |
| 2009/0087942 A1 * | 4/2009 | Meyers | ............ | H01L 21/02491 |
| | | | | 438/96 |

(Continued)

FOREIGN PATENT DOCUMENTS

| | | | | |
|---|---|---|---|---|
| JP | 2011124152 A | * | 6/2011 | |
| JP | 2017-009983 A | | 1/2017 | |

(Continued)

OTHER PUBLICATIONS

Notice of Allowance dated Feb. 4, 2026, issued in Korean Application No,. 10-2021-0193148.

*Primary Examiner* — Chad M Dicke
*Assistant Examiner* — Gary Abel
(74) *Attorney, Agent, or Firm* — Morgan, Lewis & Bockius LLP

(57)     ABSTRACT
A display device includes a substrate including an active area and a non-active area which is disposed at an outer periphery of the active area, the non-active area including a pad unit in which a plurality of pad electrodes are disposed and a non-pad unit excluding the pad unit, an insulating layer on the substrate, a pixel unit on the insulating layer, an encapsulation unit on the pixel unit, a film member below the substrate and protruding outwardly from the substrate, an organic pattern at an edge of the film member protruding outwardly from the substrate, an anisotropic conductive film on the pad electrodes, a side surface of the insulating layer, and a side surface of the substrate and a flexible film that is on the plurality of pad electrodes to be electrically connected to the pad electrodes by the anisotropic conductive film.

16 Claims, 14 Drawing Sheets

(52) U.S. Cl.
CPC ......... *H10K 59/124* (2023.02); *H10K 59/131* (2023.02); *H10K 77/111* (2023.02)

(58) Field of Classification Search
CPC .. H10K 77/111; H10K 59/8722; H10K 59/82; H10K 50/842; H10K 59/871; H10K 59/872; H10K 59/00; H10K 50/8423; H10K 59/8721; H10K 59/12; H10K 59/8791; H10K 59/873; H10K 59/1315; H10K 71/80; H10K 77/10; H10D 86/0214
See application file for complete search history.

(56) References Cited

U.S. PATENT DOCUMENTS

| | | | | |
|---|---|---|---|---|
| 2014/0065430 | A1 | 3/2014 | Yamazaki et al. | |
| 2014/0132149 | A1* | 5/2014 | Song ..................... | H10K 59/00 313/504 |
| 2014/0251430 | A1* | 9/2014 | Zhou .................... | H10K 85/111 438/82 |
| 2016/0155984 | A1 | 6/2016 | Yamazaki et al. | |
| 2016/0250827 | A1* | 9/2016 | Jung ..................... | B32B 27/281 428/446 |
| 2018/0123084 | A1* | 5/2018 | Kim ..................... | G06F 3/0412 |
| 2018/0138447 | A1* | 5/2018 | Jin ...................... | H10K 59/8722 |
| 2018/0197921 | A1* | 7/2018 | Kim ....................... | H10K 59/38 |
| 2020/0144356 | A1* | 5/2020 | Shin ..................... | H10K 59/123 |
| 2020/0403054 | A1* | 12/2020 | Jang ....................... | H01L 24/29 |
| 2021/0242249 | A1* | 8/2021 | Baek .................... | H10D 86/431 |
| 2021/0273205 | A1* | 9/2021 | Lee ........................ | H10K 50/82 |
| 2021/0357051 | A1* | 11/2021 | Tang ..................... | H10K 59/40 |

FOREIGN PATENT DOCUMENTS

| | | | |
|---|---|---|---|
| KR | 10-2014-0029181 | A | 3/2014 |
| KR | 10-2019-0012183 | A | 2/2019 |
| KR | 10-2019-0080012 | A | 7/2019 |
| KR | 10-2082651 | B1 | 3/2020 |

* cited by examiner

800

800

1000

1100

800

DISPLAY DEVICE

CROSS-REFERENCE TO RELATED APPLICATIONS

This application claims the priority of Korean Patent Application No. 10-2021-0193148 filed on Dec. 30, 2021, in the Korean Intellectual Property Office, the disclosure of which is incorporated herein by reference.

BACKGROUND

Technical Field

The present disclosure relates to a display device, and more particularly, to a display device in which a crack generated during the laser lift off (LLO) process may be minimized.

Discussion of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

SUMMARY

Accordingly, embodiments of the present disclosure are directed to a display device that substantially obviates one or more of the problems due to limitations and disadvantages of the related art.

An aspect of the present disclosure is to provide a display device which suppresses the crack generated in the pad unit.

Another aspect of the present disclosure is to provide a display device which minimizes permeation of moisture and oxide and permeation of foreign materials.

Still another aspect of the present disclosure is to provide a display device in which an organic pattern is disposed to easily perform an LLO process and a defect rate is minimized.

Still another aspect of the present disclosure is to provide a display device which removes a plastic substrate to simplify a process and reduce a manufacturing cost.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including an active area in which a plurality of pixels is defined and a non-active area which is disposed at an outer periphery of the active area, the non-active area including a pad unit in which a plurality of pad electrodes are disposed and a non-pad unit excluding the pad unit, an insulating layer on the substrate, a pixel unit on the insulating layer, an encapsulation unit on the pixel unit, a film member which is disposed below the substrate and protrudes outwardly from the substrate, an organic pattern which is disposed at an edge of the film member protruding outwardly from the substrate, an anisotropic conductive film which is disposed on the plurality of pad electrodes, a side surface of the insulating layer, and a side surface of the substrate and a flexible film which is disposed on the plurality of pad electrodes to be electrically connected to the plurality of pad electrodes by means of the anisotropic conductive film, wherein the organic pattern is in contact with the anisotropic conductive film in an area corresponding to the pad unit.

A display device according to another exemplary embodiment of the present disclosure includes a substrate including an active area in which a plurality of pixels is defined and a non-active area which is disposed at an outer periphery of the active area, the non-active area including a pad unit in which a plurality of pad electrodes are disposed and a non-pad unit excluding the pad unit; a pixel unit on the substrate; an encapsulation unit on the pixel unit; a seal member disposed in the non-active area and disposed to enclose side surfaces of the pixel unit and the encapsulation unit; a film member which is disposed below the substrate and protrudes outwardly from the substrate; an organic pattern which is disposed at an edge of the film member protruding outwardly from the substrate; an anisotropic conductive film which is disposed on the plurality of pad electrodes and a side surface of the substrate; and a flexible film which is disposed on the plurality of pad electrodes to be electrically connected to the plurality of pad electrodes by means of the anisotropic conductive film, wherein the organic pattern is in contact with the anisotropic conductive film in an area corresponding to the pad unit.

Other detailed matters of the exemplary embodiments are included in the detailed description and the drawings.

According to the present disclosure, an anisotropic conductive film overflows to suppress a crack generated below the flexible film and minimize a driving failure of a display device.

According to the present disclosure, an organic pattern is disposed so that even though an anisotropic conductive film and a seal member overflow, the LLO process may be easily performed.

According to the present disclosure, an anisotropic conductive film and a seal member overflow to suppress the permeation of moisture and oxygen and permeation of foreign materials.

According to the present disclosure, a protective film is disposed above an encapsulation unit to suppress the curling generated on the display device.

According to the present disclosure, a transparent conducting oxide layer and an oxide semiconductor layer are used as a substrate of the display device to easily control a moisture permeability.

According to the present disclosure, a thin transparent conducting oxide layer and an oxide semiconductor layer are used as a substrate of the display device to improve a flexibility of the display device.

According to the present disclosure, a thin transparent conducting oxide layer and a thin oxide semiconductor layer are used as substrates of a display device to relieve a stress generated when the display device is bent or rolled and reduce a crack of the display device.

According to the present disclosure, a transparent conducting oxide layer and an oxide semiconductor layer are used as substrates of the display device to simplify a structure of the display device and reduce a manufacturing cost.

According to the present disclosure, a transparent conducting oxide layer and an oxide semiconductor layer are used as substrates of the display device to reduce the generation of static electricity and improve a display quality.

According to the present disclosure, the substrate of the display device may be manufactured by a deposition process in a vacuum environment so that a substrate manufacturing time is shortened and foreign materials formed on the substrate and a defect thereby may be minimized.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

4

Figure 1:
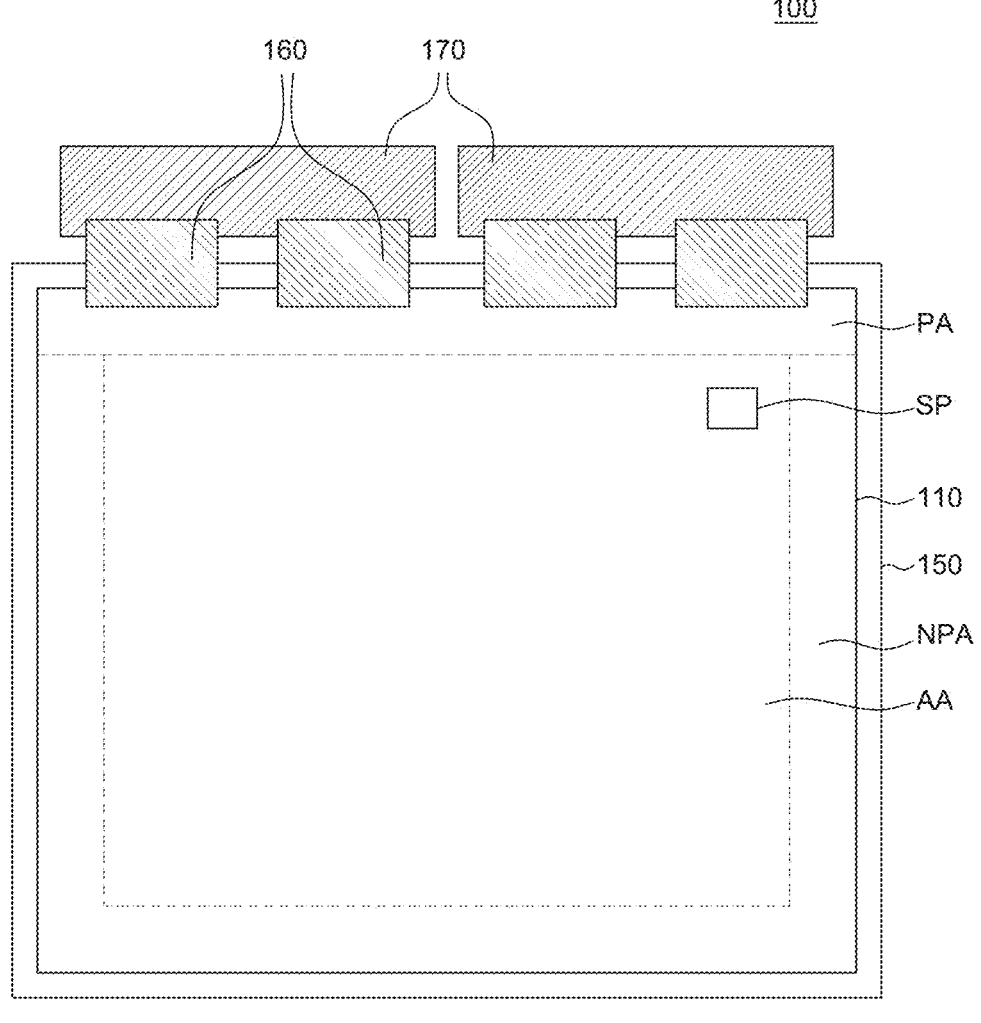
FIG. 1 is a plan view of a display device according to an exemplary embodiment of the present disclosure.

FIGS. 13A to 13D are cross-sectional views schematically illustrating a manufacturing method of a display device according to another exemplary embodiment of the present disclosure.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
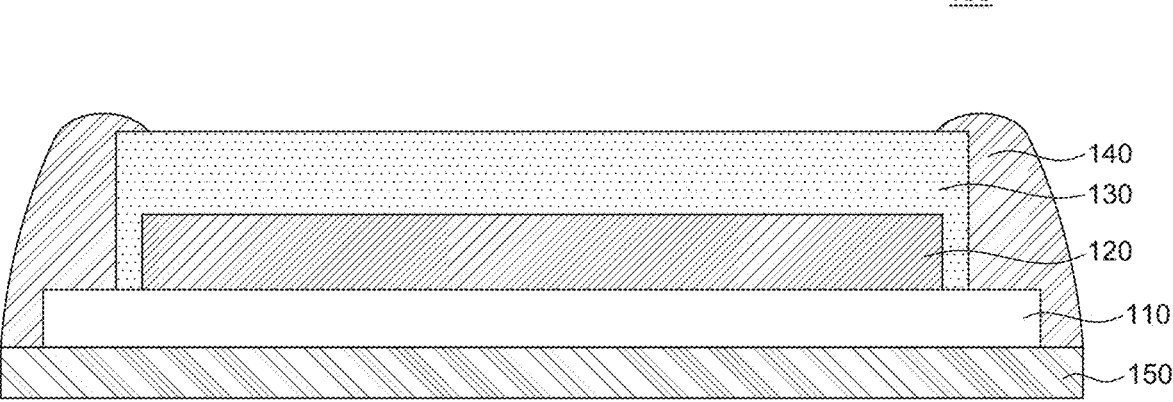
FIG. 2 is a schematic cross-sectional view of a display device according to an exemplary embodiment of the present disclosure.

FIG. 1 is a plan view of a display device according to an exemplary embodiment of the present disclosure. FIG. 2 is a schematic cross-sectional view of a display device according to an exemplary embodiment of the present disclosure. For the convenience of description, in FIG. 1, among various components of the display device 100, only a substrate 110, a plurality of flexible films 160, and a plurality of printed circuit boards 170 are illustrated. In FIG. 2, for the convenience of description, only a film member 150, a substrate 110, a pixel unit 120, an encapsulation unit 130, and a seal member 140 are illustrated.

Referring to FIGS. 1 and 2, the substrate 110 is a base member which supports various components of the display panel and may be configured by an insulating material. The substrate 110 may be formed of a material having a flexibility to allow the display panel to be wound or unwound and for example, may be formed of a plastic material such as polyimide (PI).

The substrate 110 includes an active area AA and a non-active area NA.

The active area AA is an area where a plurality of sub pixels SP is included to display images. In the active area AA, a pixel unit 120 configured by a plurality of sub pixels SP may be disposed to display images. For example, the pixel unit 120 is configured by a plurality of sub pixels SP including a light emitting diode and a driving circuit to display images.

The non-active area NA is an area of an outer periphery of the active area AA and images are not displayed in the non-active area. The non-active area NA may be disposed so as to enclose the active area AA.

The non-active area NA includes a pad unit PA and a non-pad unit NPA excluding the pad unit PA.

In the pad unit PA, images are not displayed and a plurality of pad electrodes is disposed. The pad unit PA extends from one side of the active area AA. The pad unit PA is an area in which a plurality of pad electrodes and an external module, for example, a flexible film 160 are bonded to be electrically connected.

The non-pad unit NPA extends from a side portion of the other active area AA in which the pad unit PA is not disposed. The non-pad unit NPA may extend from three side portions of the active area AA. For example, a gate driver may be disposed in the non-pad unit NPA.

The plurality of flexible films 160 is disposed at one end of the substrate 110. The plurality of flexible films 160 is electrically connected to one end of the substrate 110. The plurality of flexible films 160 is films in which various components are disposed on a base film having malleability to supply a signal to the plurality of sub pixels of the active area AA. One ends of the plurality of flexible films 160 are disposed in the non-active area NA of the substrate 110 to supply a data voltage or the like to the plurality of sub pixels SP of the active area AA. In the meantime, even though four flexible films 160 are illustrated in FIG. 1, the number of flexible films 160 may vary depending on the design, but is not limited thereto.

The printed circuit board 170 is connected to the plurality of flexible films 160. The printed circuit board 170 is a component which supplies signals to the driving Integrated Circuit(IC). Various components may be disposed in the printed circuit board 170 to supply various driving signals such as a driving signal or a data voltage to the driving Integrated Circuit (IC). In the meantime, even though two printed circuit boards 170 are illustrated in FIG. 1, the number of printed circuit boards 170 may vary depending on the design and is not limited thereto.

The pixel unit 120 is disposed on the substrate 110. The pixel unit 120 may be disposed so as to correspond to the active area AA. The pixel unit 120 is a component which includes a plurality of sub pixels SP to display images. The plurality of sub pixels SP of the pixel unit 120 is minimum units which configure the active area AA and a light emitting diode and a driving circuit may be disposed in each of the plurality of sub pixels SP. For example, the light emitting diode of each of the plurality of sub pixels SP may include an organic light emitting diode including an anode, an organic emission layer, and a cathode or an light emitting diode(LED) including an N-type and a P-type semiconductor layers and an emission layer, but is not limited thereto. The driving circuit for driving the plurality of sub pixels may include a driving element such as a thin film transistor or a storage capacitor, but is not limited thereto. Hereinafter, for the convenience of description, it is assumed that the light emitting diode of each of the plurality of sub pixels SP is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary embodiment of the present disclosure is a bottom emission type display device, but it is not limited thereto.

The encapsulation unit 130 is disposed to cover the pixel unit 120. The encapsulation unit 130 seals the pixel unit 120 to protect the light emitting diode of the pixel unit 120 from moisture, oxygen, and impacts of the outside. The encapsulation unit 130 may be formed by alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of epoxy-based or acrylic-based polymer, but they are not limited thereto. Further, the encapsulation unit 130 may be configured by a face seal type. For example, the encapsulation unit 130 may be formed by forming ultraviolet or thermosetting sealant on the entire surface of the pixel unit 120. However, the structure of the encapsulation unit 130 may be formed by various methods and materials, but is not limited thereto.

In the meantime, an encapsulation substrate which has a high modulus and is formed of a metal material having a strong corrosion resistance may be further disposed on the encapsulation unit 130. For example, the encapsulation substrate may be formed of a material having a high modulus of approximately 200 to 900 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate is formed of a metal material, the encapsulation substrate may be implemented as an ultra-thin film and provide a strong resistance against external impacts and scratches.

A seal member 140 is disposed so as to enclose side surfaces of the pixel unit 120 and the encapsulation unit 130. The seal member 140 is disposed in the non-active area NA and may be disposed to enclose the pixel unit 120 disposed in the active area AA. The seal member 140 is disposed so as to enclose a side surface of the pixel unit 120 and a side surface of the encapsulation unit 130 to minimize the moisture permeation to the pixel unit 120. For example, the seal member 140 may be disposed so as to cover a side surface of the encapsulation unit 130 which is disposed so as to enclose the pixel unit 120 and a part of an upper surface of the encapsulation unit 130.

The seal member 140 may be formed of a non-conductive material having an elasticity so as to encapsulate the side surface of the pixel unit 120 and reinforce the rigidity of the side surface of the display device 100. Further, the seal member 140 may be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), poly urethane, epoxy, or acryl based material, but is not limited thereto.

The film member 150 is disposed below the substrate 110 to protrude outwardly from the substrate 110. The film member 150 may include at least one of a polarizing plate and a barrier film. The polarizing plate selectively transmits light to reduce the reflection of external light which is incident onto the substrate 110. Specifically, in the display device 100, various metal materials which are applied to semiconductor devices, wiring lines, and light emitting diodes are formed on the substrate 110. Therefore, the external light incident onto the substrate 110 may be reflected from the metal material so that the visibility of the display device 100 may be reduced due to the reflection of the external light. At this time, the polarizing plate which suppresses the reflection of external light is disposed below the substrate 110 to increase outdoor visibility of the display device 100. However, the polarizing plate may be omitted depending on an implementation example of the display device 100.

In the meantime, a barrier film may be disposed below the substrate 110 together with the polarizing plate or in a state in which the polarizing plate is omitted. The barrier film minimizes the permeation of the moisture and oxygen outside the substrate 110 into the substrate 110 to protect the pixel unit 120 including a light emitting diode. However, the barrier film may be omitted depending on an implementation example of the display device 100, but it is not limited thereto.

Even though it is not illustrated in the drawing, an adhesive layer may be disposed between the film member 150 and the substrate 110. The adhesive layer is formed of a material having adhesiveness and may be a thermosetting or natural curable type adhesive.

Hereinafter, the plurality of sub pixels SP of the pixel unit 120 will be described in more detail with reference to FIGS. 3 to 5.

Figure 3:
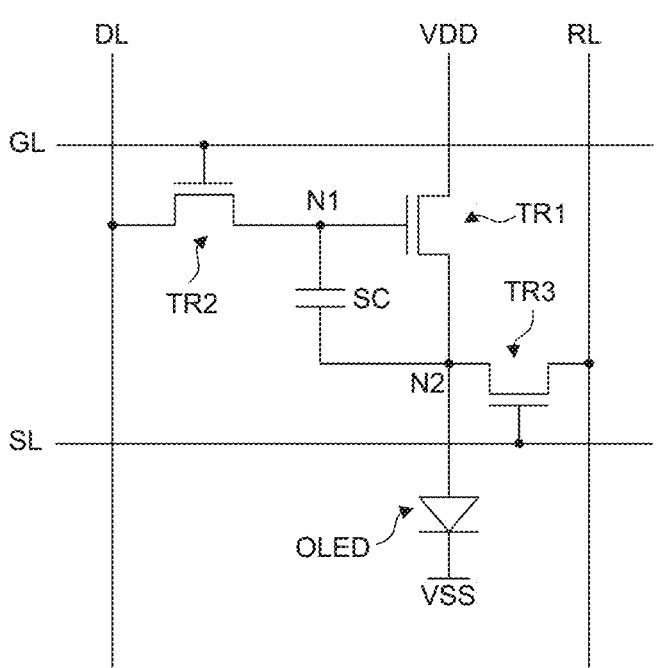
FIG. 3 is a circuit diagram of a sub pixel of a display device according to an exemplary embodiment of the present disclosure.

FIG. 3 is a circuit diagram of a sub pixel of a display device according to an exemplary embodiment of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current may flow from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer ACT1, a first gate electrode GE1, a first source electrode SE1, and a first drain electrode DE1. The first gate electrode GE1 is connected to a first node N1, the first source electrode SE1 is connected to the anode of the light emitting diode OLED, and the first drain electrode DE1 is connected to the high potential power line VDD. When a voltage of the first node N1 is higher than a threshold voltage, the first transistor TR1 is turned on and when the voltage of the first node N1 is lower than the threshold voltage, the first transistor TR1 may be turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer ACT2, a second gate electrode GE2, a second source electrode SE2, and a second drain electrode DE2. The second gate electrode GE2 is connected to the gate line GL, the second source electrode SE2 is connected to the first node N1, and the second drain electrode DE2 is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer ACT3, a third gate electrode GE3, a third source electrode SE3, and a third drain electrode DE3. The third gate electrode GE3 is connected to the sensing line SL, the third source electrode SE3 is connected to the second node N2, and the third drain electrode DE3 is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of a plurality of capacitor electrodes is connected to the first node N1 and the other one is connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary embodiment of the present disclosure has a 3T1C structure including three transistors and one storage capacitor SC. However, the number and a connection relationship of the transistors and the storage capacitor SC may vary in various ways depending on the design and are not limited thereto.

Figure 4:
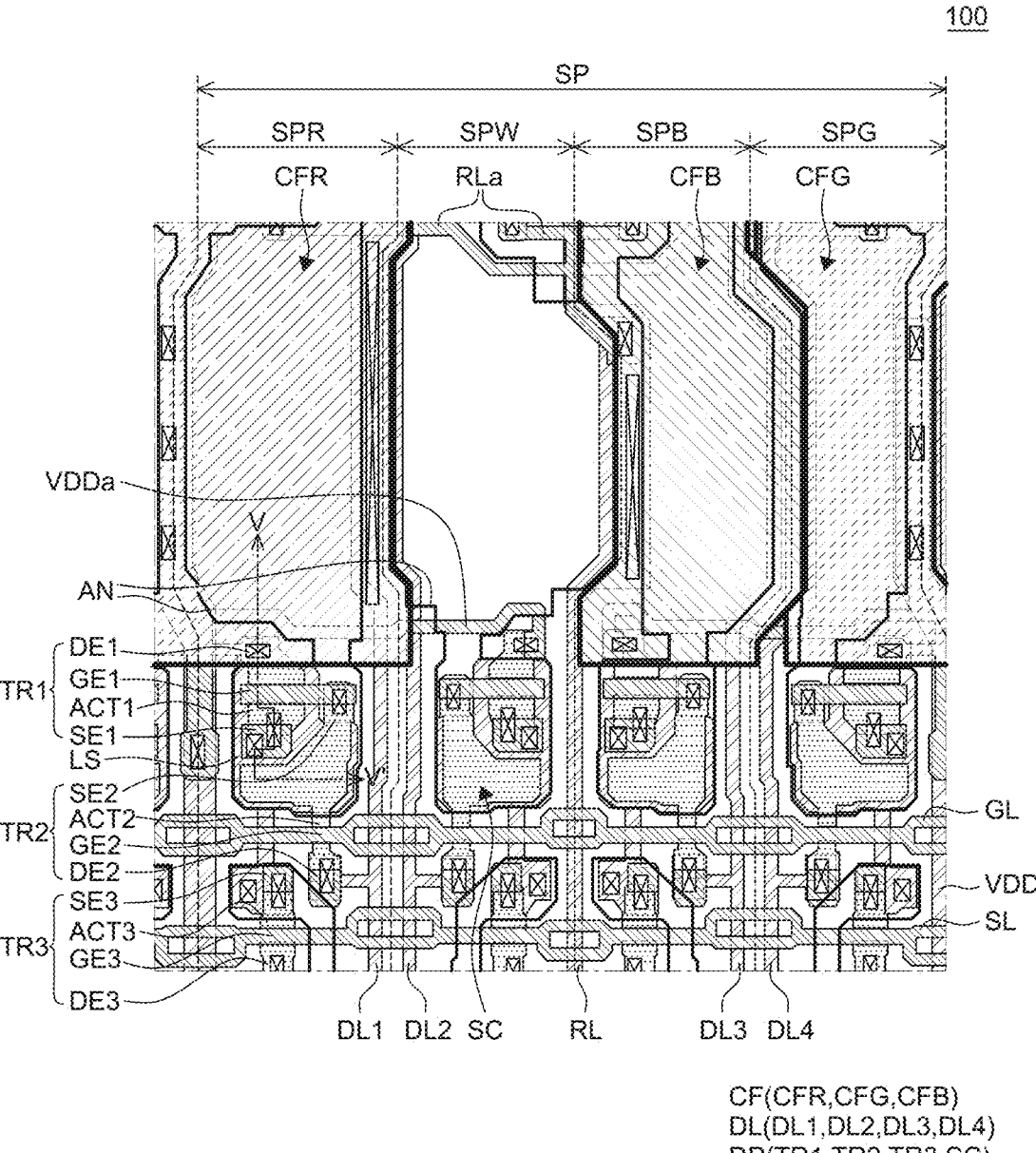
FIG. 4 is an enlarged view of an area A of FIG. 1.

FIG. 4 is an enlarged view of an area A of FIG. 1. FIG. 5 is a schematic cross-sectional view taken along V-V' of FIG. 4. FIG. 4 is an enlarged plan view of a red sub pixel SPR, a white sub pixel SPW, a blue sub pixel SPB, and a green sub pixel SPG which configure one pixel. In FIG. 4, for the convenience of description, the bank 115 is omitted and edges of the plurality of color filters CF are illustrated with a bold solid line.

Figure 5:
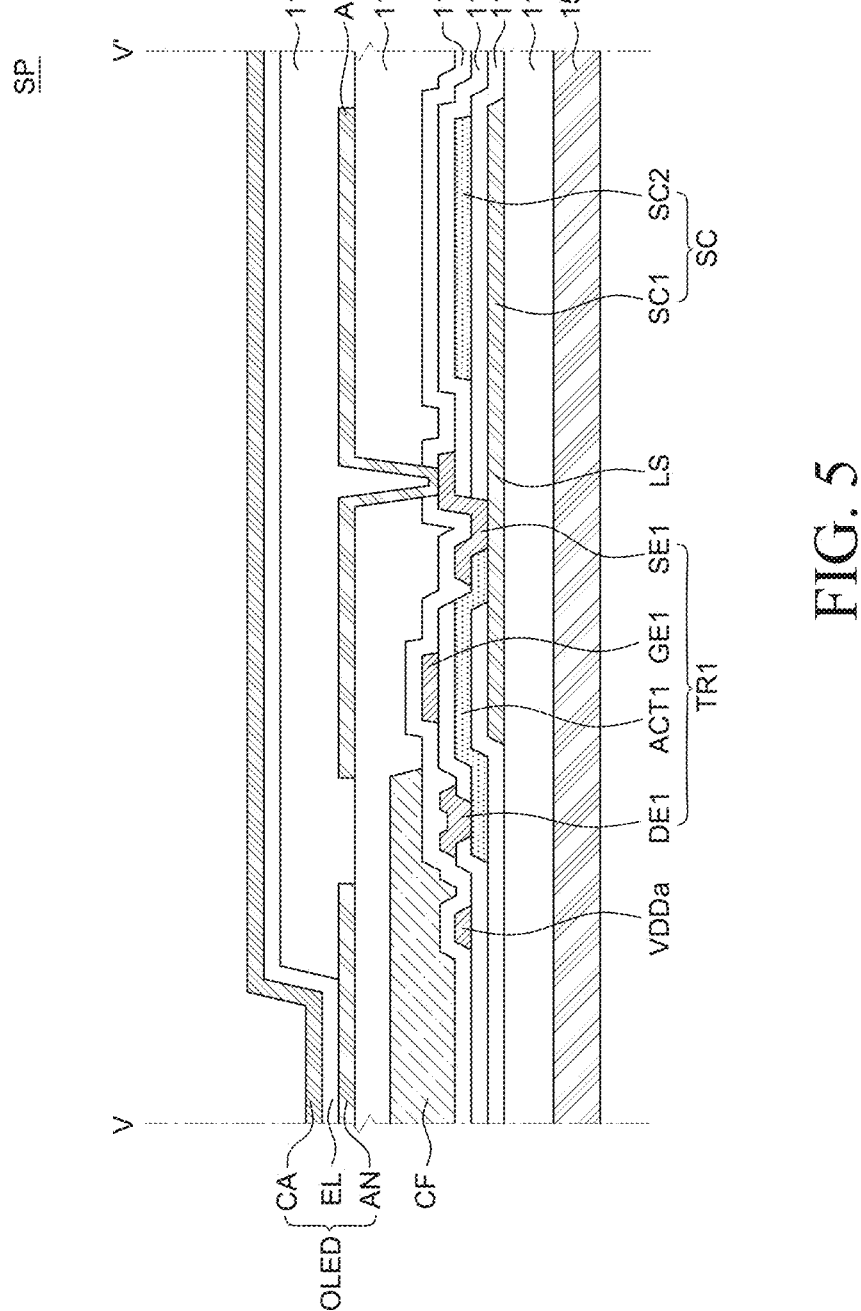
FIG. 5 is a schematic cross-sectional view taken along V-V' of FIG. 4.

Referring to FIGS. 4 and 5, the display device 100 according to the exemplary embodiment of the present disclosure includes a substrate 110, a light shielding layer LS, an auxiliary high potential power line VDDa, a storage capacitor SC, a first transistor TR1, a light emitting diode OLED, a color filter CF, a buffer layer 111, a gate insulating layer 112, a passivation layer 113, a planarization layer 114, and a bank 115.

The plurality of high potential power lines VDD, the plurality of data lines DL, the plurality of reference lines RL, and the light shielding layer LS are disposed on the same layer of the substrate 110 and formed of the same conductive material. For example, the plurality of high potential power lines VDD, the plurality of data lines DL, the plurality of reference lines RL, and the light shielding layer LS may be configured by a conductive material, such as copper (Cu), aluminum (Al), molybdenum (Mo), nickel (Ni), titanium (Ti), chrome (Cr), or an alloy thereof, but are not limited thereto.

The plurality of high potential power lines VDD is wiring lines which transmit the high potential power signal to each of the plurality of sub pixels SP. The plurality of high potential power lines VDD may extend between the plurality of sub pixels SP in a column direction and two sub pixels SP which are adjacent to each other in the row direction may share one high potential power line VDD among the plurality of high potential power lines VDD.

The plurality of data lines DL extends between the plurality of sub pixels SP in the column direction to transmit a data voltage to each of the plurality of sub pixels SP.

The plurality of reference lines RL extends between the plurality of sub pixels SP in the column direction to transmit a reference voltage to each of the plurality of sub pixels SP. The plurality of sub pixels SP which forms one pixel may share one reference line RL.

Referring to FIG. 5, a light shielding layer LS is disposed on the substrate 110. The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap the first active layer ACT1, light incident from the lower portion of the substrate 110 onto the first active layer ACT1 may be blocked. Accordingly, the reliability of the first transistor TR1 may be improved. However, it is not limited thereto and the light shielding layer LS may be disposed so as to overlap the second active layer of the second transistor TR2 and the third active layer of the third transistor TR3.

In the meantime, even though in the drawing, it is illustrated that the light shielding layer LS is a single layer, the light shielding layer LS may be formed as a plurality of layers. For example, the light shielding layer LS may be formed of a plurality of layers disposed so as to overlap each other with at least one of the buffer layer 111, the gate insulating layer 112, and the passivation layer 113 therebetween.

The buffer layer 111 which is an inorganic insulating layer is disposed on the plurality of high potential power lines VDD, the plurality of data lines DL, the plurality of reference lines RL, and the light shielding layer LS. The buffer layer 111 may reduce permeation of moisture or impurities through the substrate 110. For example, the buffer layer 111 may be configured by a single layer or a double layer of silicon oxide SiOx or silicon nitride SiNx, but is not limited thereto. Further, the buffer layer 111 may be omitted depending on a type of substrate 110 or a type of transistor, but is not limited thereto.

In each of the plurality of sub pixels SP, the first transistor TR1, the second transistor TR2, the third transistor TR3, and the storage capacitor SC are disposed on the buffer layer 111.

In the meantime, in FIG. 5, a cross-section of a first transistor TR1, among the first transistor TR1, the second transistor TR2, and the third transistor TR3 is illustrated. The first transistor TR1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a double layer of silicon oxide SiOx or silicon nitride SiNx, but is not limited thereto.

The first gate electrode GE1 is disposed on the gate insulating layer 112 so as to overlap the first active layer ACT1. The first gate electrode GE1 may be configured by a conductive material such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 112. The first source electrode SE1 and the first drain electrode DE1 may be electrically connected to the first active layer ACT1 through a contact hole formed on the gate insulating layer 112. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end is electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 112 and the buffer layer 111. The other end of the auxiliary high potential power line VDDa extends to the first drain electrode DE1 to be integrally formed with the first drain electrode DE1.

The first source electrode SE1 may be electrically connected to the light shielding layer LS through a contact hole formed on the gate insulating layer 112 and the buffer layer 111. Further, a part of the first active layer ACT1 connected to the first source electrode SE1 may be electrically connected to the light shielding layer LS through a contact hole formed on and the buffer layer 111. If the light shielding layer LS is floated, a threshold voltage of the first transistor TR1 varies to affect the driving of the display device 100. Accordingly, the light shielding layer LS is electrically connected to the first source electrode SE1 to apply a voltage to the light shielding layer LS and it may not affect the driving of the first transistor TR1. However, in the present specification, even though it has been described that both the first active layer ACT1 and the first source electrode SE1 are in contact with the light shielding layer LS, only any one of the first source electrode SE1 and the first active layer ACT1 is in direct contact with the light shielding layer. It is not limited thereto.

In the meantime, even though in FIG. 5, it is illustrated that the gate insulating layer 112 is formed on the entire substrate 110, the gate insulating layer 112 may be patterned so as to overlap only the first gate electrode GE1, the first source electrode SE1, and the first drain electrode DE1, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode SC1 and a second capacitor electrode SC2.

In each of the plurality of sub pixels SP, the first capacitor electrode SC1 is disposed between the substrate 110 and the buffer layer 111. The first capacitor electrode SC1 may be disposed to be the closest to the substrate 110 among the conductive components disposed on the substrate 110. The first capacitor electrode SC1 may be integrally formed with the light shielding layer LS and may be electrically connected to the first source electrode SE1 by means of the light shielding layer LS.

The passivation layer 113 which is an inorganic insulating layer is disposed on the first transistor TR1, the second transistor TR2, the third transistor TR3, and the storage capacitor SC. The passivation layer 113 is an insulating layer for protecting the structure below the passivation layer 113.

The passivation layer 113 may be configured by a single layer or a double layer of silicon oxide SiOx or silicon nitride SiNx, but is not limited thereto. Further, the passivation layer 113 may be omitted depending on the exemplary embodiment.

The plurality of color filters CF includes a red color filter, a blue color filter, and a green color filter. The red color filter may be disposed in an emission area of a red sub pixel, among the plurality of sub pixels SP, the blue color filter may be disposed in an emission area of a blue sub pixel, and the green color filter may be disposed in an emission area of a green sub pixel.

The planarization layer 114 is disposed on the passivation layer 113 and the plurality of color filters CF. The planarization layer 114 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be formed of an organic material, and for example, may be configured by a single layer or a double layer of polyimide or photo acryl, but is not limited thereto.

The light emitting diode OLED is disposed in an emission area of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN may extend toward the circuit area. A part of the anode AN may extend toward the first source electrode SE1 of the circuit area from the emission area and may be electrically connected to the first source electrode SE1 through a contact hole formed in the planarization layer 114 and the passivation layer 113. Accordingly, the anode AN of the light emitting diode OLED extends to the circuit area to be electrically connected to the first source electrode SE1 of the first transistor TR1 and the second capacitor electrode SC2 of the storage capacitor SC.

In the emission area and the circuit area, the emission layer EL is disposed on the anode AN. The emission layer EL may be formed as one layer over the plurality of sub pixels SP. That is, the emission layers EL of each of the plurality of sub pixels SP are connected to each other to be integrally formed. The emission layer EL may be configured by one emission layer or may have a structure in which a plurality of emission layers which emits different color light is laminated. The emission layer EL may further include an organic layer such as a hole injection layer, a hole transport layer, an electron transport layer, and an electron injection layer.

The cathode CA is disposed on the emission layer EL in the emission area and the circuit area. The cathode CA supplies electrons to the emission layer EL so that the cathode may be formed of a conductive material having a low work function. The cathode CA may be formed as one layer over the plurality of sub pixels SP. That is, the cathodes CA of each of the plurality of sub pixels SP are connected to each other to be integrally formed. For example, the cathode CA may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 5A to 5C, the cathode CA of the light emitting diode OLED is electrically connected to the low potential power line VSS to be supplied with a low potential power voltage.

The bank 115 is disposed between the anode AN and the emission layer EL. The bank 115 is disposed to overlap the active area AA and cover the edge of the anode AN. The bank 115 is disposed at the boundary between the sub pixels SP which are adjacent to each other to reduce the mixture of light emitted from the light emitting diode OLED of each of the plurality of sub pixels SP. The bank 115 may be formed of, for example, an insulating material such as, polyimide, acryl, or benzocyclobutene (BCB) based resin, but it is not limited thereto.

Hereinafter, an organic pattern disposed in a non-active area will be described in more detail with reference to FIGS. 6 to 7B.

Figure 6:
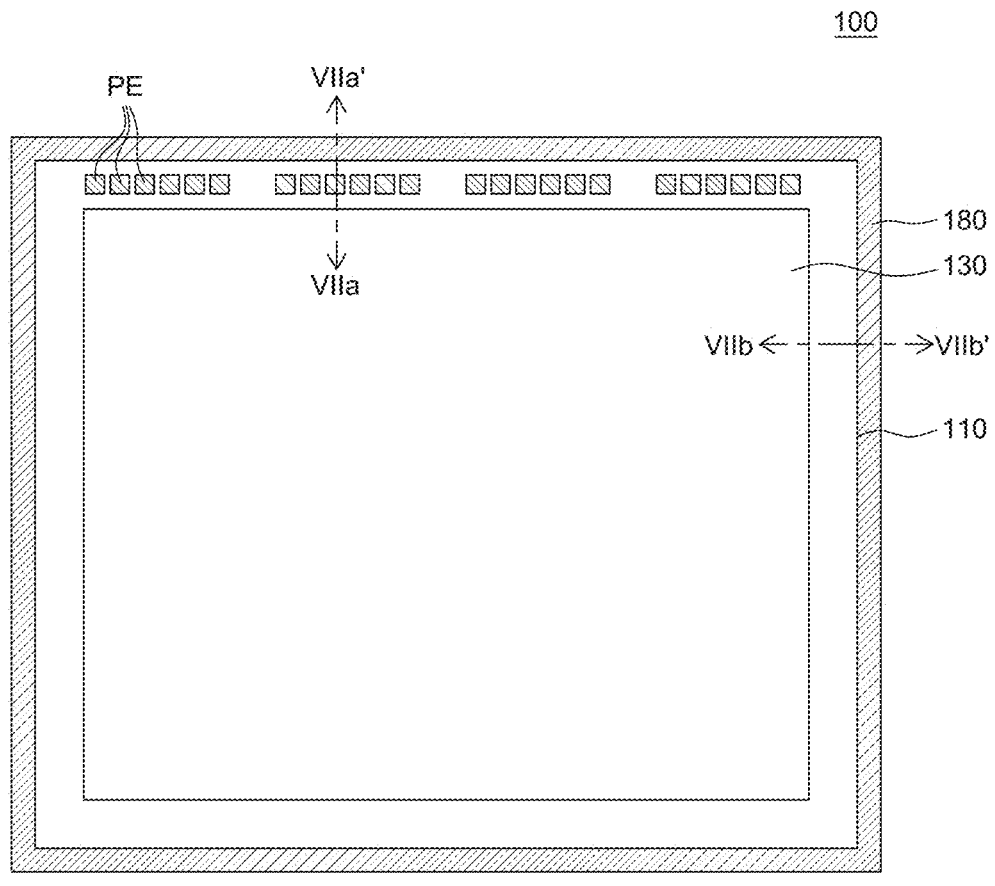
FIG. 6 is a schematic plan view of a part of a display device according to an exemplary embodiment of the present disclosure.
Figure 7A:
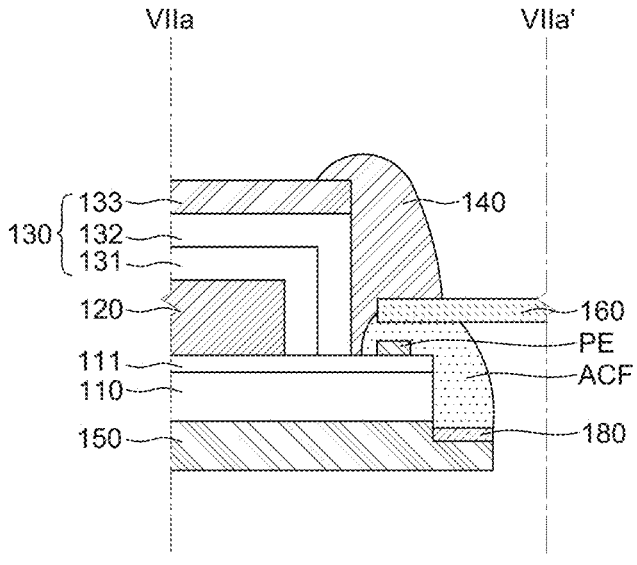
FIG. 7A is a cross-sectional view taken along a line VIIa-VIIa' of FIG. 6.

FIG. 6 is a schematic plan view of a part of a display device according to an exemplary embodiment of the present disclosure. FIG. 7A is a cross-sectional view taken along the line VIIa-VIIa' of FIG. 6. FIG. 7B is a cross-sectional view taken along the line VIIb-VIIb' of FIG. 6. Specifically, FIG. 7A is a cross-sectional view of an area in which the flexible film 160 is disposed and FIG. 7B is a cross-sectional view of an area in which a flexible film 160 is not disposed. In FIG. 6, for the convenience of description, among components of the display device 100, only the substrate 110, a pad electrode PE, an organic pattern 180, and an encapsulation unit 130 are illustrated.

Referring to FIG. 6, the plurality of pad electrodes PE is disposed on the substrate 110 of the pad unit PA. The pad electrode PE is electrically connected to the flexible film 160 by means of an anisotropic conductive film ACF. Therefore, the pad electrode PE may be connected to the printed circuit board 170 by means of the flexible film 160. In the meantime, the pad electrode PE may be connected to the plurality of sub pixels SP, by means of a link line. Here, the pad electrode PE may be formed of the same material as one of various conductive components, such as a first gate electrode GE1, a first source electrode SE1, and a first drain electrode DE1, and an anode AN of the first transistor TR1. Further, the pad electrode PE may be partially covered by one or more insulating layers.

Figure 7B:
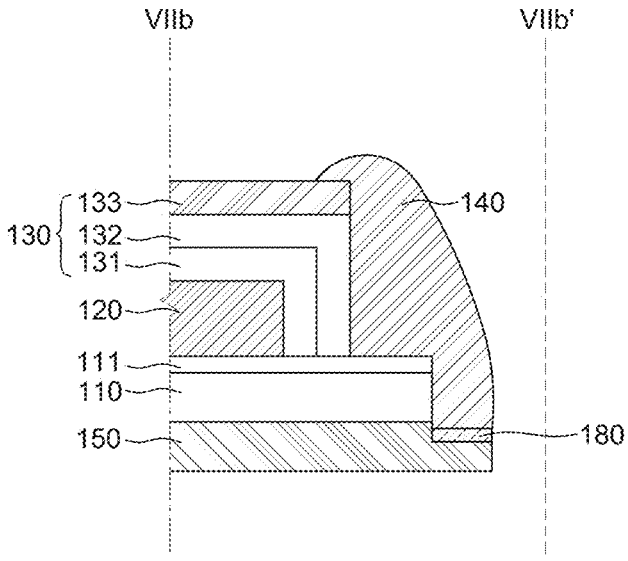
FIG. 7B is a cross-sectional view taken along a line VIIb-VIIb' of FIG. 6.

Referring to FIGS. 6 to 7B, the encapsulation unit 130 is disposed on the pixel unit 120. The encapsulation unit 130 is disposed in a smaller area than the substrate 110 including the active area AA and may be disposed so as to enclose the pixel unit 120. The encapsulation unit 130 includes an encapsulation layer 131 which is in contact with the pixel unit 120, an adhesive layer 132 disposed on the encapsulation layer 131, and an encapsulation substrate 133 disposed on the adhesive layer 132.

The encapsulation layer 131 seals the light emitting diode OLED of the pixel unit 120. The encapsulation layer 131 may protect the light emitting diode OLED of the pixel unit 120 from moisture, oxygen, and impacts of the outside. The encapsulation layer 131 may be formed of a single inorganic layer or formed by alternatively laminating one or more inorganic layers and one or more organic layers. For example, the inorganic layer may be formed of an inorganic material such as silicon nitride SiNx, silicon oxide SiOx, and aluminum oxide AlOx and the organic layer may use epoxy-based or acrylic-based polymer, but they are not limited thereto.

The encapsulation substrate 133 is disposed on the encapsulation layer 131. The encapsulation substrate 133 protects the light emitting diode OLED of the pixel unit 120 together with the encapsulation layer 131. The encapsulation substrate 133 may protect the light emitting diode OLED of the pixel unit 120 from moisture, oxygen, and impacts of the outside. The encapsulation substrate 133 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 133 is formed of a metal material, the encapsulation substrate 133 may be implemented by an ultra-thin film and have a high resistance against external impacts and scratches.

The adhesive layer 132 may be disposed between the encapsulation layer 131 and the encapsulation substrate 133. The adhesive layer 132 may bond the encapsulation layer 131 and the encapsulation substrate 133 to each other. The adhesive layer 132 is formed of a material having an adhesiveness and may be a thermosetting or natural curable type adhesive. For example, the adhesive layer 132 may be formed of an optical clear adhesive (OCA) or a pressure sensitive adhesive (PSA), but is not limited thereto.

In the meantime, the adhesive layer 132 may be disposed to enclose the encapsulation layer 131 and the pixel unit 120. That is, the pixel unit 120 may be sealed by the buffer layer 111 and the encapsulation layer 131 and the encapsulation layer 131 and the pixel unit 120 may be sealed by the buffer layer 111 and the adhesive layer 132. The adhesive layer 132 may protect the organic light emitting diode of the pixel unit 120 from moisture, oxygen, and impacts of the outside together with the encapsulation layer 131 and the encapsulation substrate 133. In this case, the adhesive layer 132 may further include an absorbent. The absorbent may be particles having hygroscopicity and absorb moisture and oxygen from the outside to minimize permeation of the moisture and oxygen into the pixel unit 120.

Referring to FIG. 7A, the plurality of flexible films 160 is disposed on the plurality of pad electrodes PE and is electrically connected to the plurality of pad electrodes PE. Here, the plurality of flexible films 160 and the plurality of pad electrodes PE are attached by means of the anisotropic conductive film ACF. The flexible film 160 is pressurized to be electrically connected with the pad electrode PE of the pad unit PA of the substrate 110 by means of conductive balls in the anisotropic conductive film ACF. Accordingly, a data signal and a power which is applied by means of the flexible film 160 may be applied to a plurality of signal lines connected from the active area AA.

The organic pattern 180 is disposed on an edge of the film member 150 which protrudes outwardly from the substrate 110. That is, the organic pattern 180 may be disposed so as to enclose the substrate 110. As illustrated in FIGS. 7A and 7B, an upper surface of the organic pattern 180 may be lower than an upper surface of the substrate 110. However, it is not limited thereto and the upper surface of the organic pattern 180 may be equal to the height of the substrate 110.

The organic pattern 180 is formed of a material which can be decomposed by a laser. Therefore, the organic pattern 180 may be used during the LLO process by the same principle of the sacrificial layer. For example, the organic pattern 180 may include at least one from a group consisting of xylene, toluene, ethyl acetate, terpene, and turpentine.

In the meantime, the organic pattern 180 may include a pigment. In order to more smoothly absorb the laser, the organic pattern 180 may include a pigment. At this time, the pigment may be various color pigments such as a red pigment, a green pigment, a blue pigment, and a black pigment.

In the pad unit PA, the anisotropic conductive film ACF is disposed on an upper edge of the buffer layer 111, a side surface of the buffer layer 111, and a side surface of the substrate 110. The anisotropic conductive film ACF overflows from the edge of the buffer layer 111 to be in contact with not only the upper portion of the buffer layer 111, but also the side surfaces of the buffer layer 111 and the substrate 110.

Referring to FIG. 7A, the anisotropic conductive film ACF may enclose a part of the organic pattern 180 in the pad unit PA. Specifically, in an area of the pad unit PA in which the anisotropic conductive film ACF is disposed, a part of the organic pattern 180 adjacent to the pad electrode PE may be enclosed by the anisotropic conductive film ACF and is in contact with the anisotropic conductive film ACF. At this time, the anisotropic conductive film ACF may be in contact with the side surface of the substrate 110 and the upper surface of the organic pattern 180.

Referring to FIG. 7B, in the non-pad unit NPA, the organic pattern 180 is in contact with the seal member 140. The seal member 140 is in contact with the edge of the encapsulation unit 130 and the side surface of the encapsulation unit 130 and may also be in contact with the upper surface of the buffer layer 111 and the side surface of the substrate 110. The seal member 140 is in contact with the organic pattern 180 disposed below the substrate 110, at an outside of the circumference of the substrate 110 so that the seal member 140 may seal not only the side surface of the encapsulation unit 130, but also the side surfaces of the buffer layer 111 and the substrate 110. At this time, the seal member 140 may be in contact with the side surface of the substrate 110 and the upper surface of the organic pattern 180.

As illustrated in FIG. 7A, in the area of the pad unit PA in which the anisotropic conductive film ACF is disposed, the seal member 140 may be in contact with the edge of the encapsulation unit 130, the side surface of the encapsulation unit 130, and a part of the upper surface of the flexible film 160 adjacent to the encapsulation unit 130. In the meantime, as illustrated in FIG. 7B, in an area of the pad unit PA in which the anisotropic conductive film ACF is not disposed and the non-pad unit NPA area, the seal member 140 may be in contact with the edge of the encapsulation unit 130, the side surface of the encapsulation unit 130, the side surface of the substrate 110, and the organic pattern 180.

During the process of manufacturing the display device, both the anisotropic conductive film and the seal member are desirably disposed to cover the entire upper surface of the substrate. That is, the anisotropic conductive film and the seal member are desirably disposed to cover all the upper surface of the buffer layer disposed on the substrate. However, it is very difficult to accurately apply the anisotropic conductive film and the seal member. For example, when the anisotropic conductive film and the seal member overflow during the manufacturing process, the anisotropic conductive film and the seal member flow down to the side surface of the temporary substrate used during the LLO process so that the LLO is not performed. Therefore, in order to suppress the overflow, it is considered that the anisotropic conductive film and the seal member are not applied in an area adjacent to an end above the substrate. However, when the anisotropic conductive film is not applied in an area adjacent to an end above the substrate, a problem in that the inorganic film or wiring line above the substrate are cracked may be caused. Further, when the seal member is not applied in an area adjacent to an end above the substrate, a problem in that foreign materials are disposed in the corresponding area to be scattered may be caused.

Accordingly, in the display device 100 according to the exemplary embodiment of the present disclosure, the organic pattern 180 is disposed at the outside of the edge of the substrate 110 and the anisotropic conductive film ACF and the seal member 140 overflow to be in contact with the organic pattern 180. At this time, the organic pattern 180 is formed of a material which can be decomposed by the laser so that the LLO process may be performed on the organic pattern 180. Accordingly, in the display device 100 according to the exemplary embodiment of the present disclosure, even though the anisotropic conductive film ACF and the seal member 140 overflow during the manufacturing process, the anisotropic conductive film ACF and the seal member 140 do not flow down to the side surface of the temporary substrate. Therefore, the LLO process may be normally performed.

Further, in the display device 100 according to the exemplary embodiment of the present disclosure, the anisotropic conductive film ACF and the seal member 140 overflow so that the anisotropic conductive film and the seal member may seal the side surface of the buffer layer 111 and the side surface of the substrate 110. Accordingly, the permeation of moisture or oxygen through the side surface of the buffer layer 111 and the side surface of the substrate 110 may be minimized.

Further, in the display device 100 according to the exemplary embodiment of the present disclosure, the anisotropic conductive film ACF and the seal member 140 overflow so that the anisotropic conductive film ACF and the seal member 140 are covered in an area adjacent to the end above the substrate 110. Therefore, in the display device 100 according to the exemplary embodiment of the present disclosure, the crack of the inorganic layer and the wiring line to be generated when the anisotropic conductive film ACF and the seal member 140 are not disposed in an area adjacent to the end above the substrate 110 may be suppressed. Further, the scattering problem of the foreign materials may be also suppressed.

Figure 8:
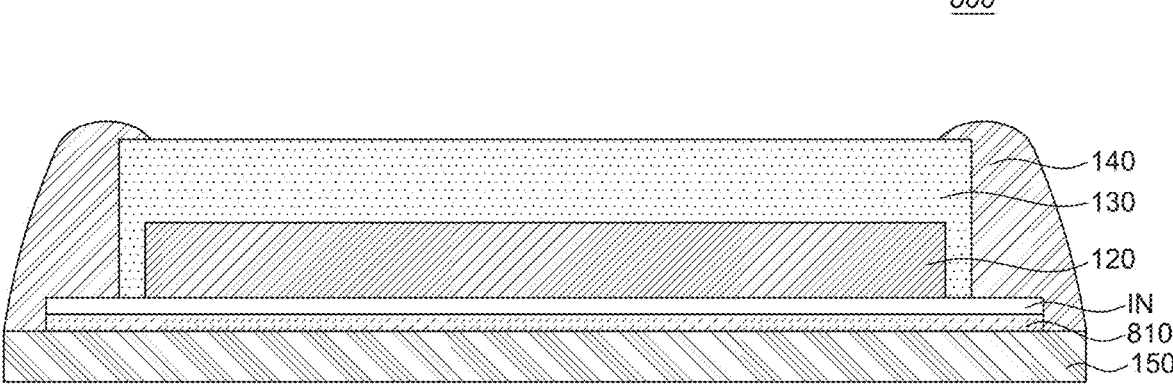
FIG. 8 is a schematic plan view of a display device according to another exemplary embodiment of the present disclosure.
Figure 9A:
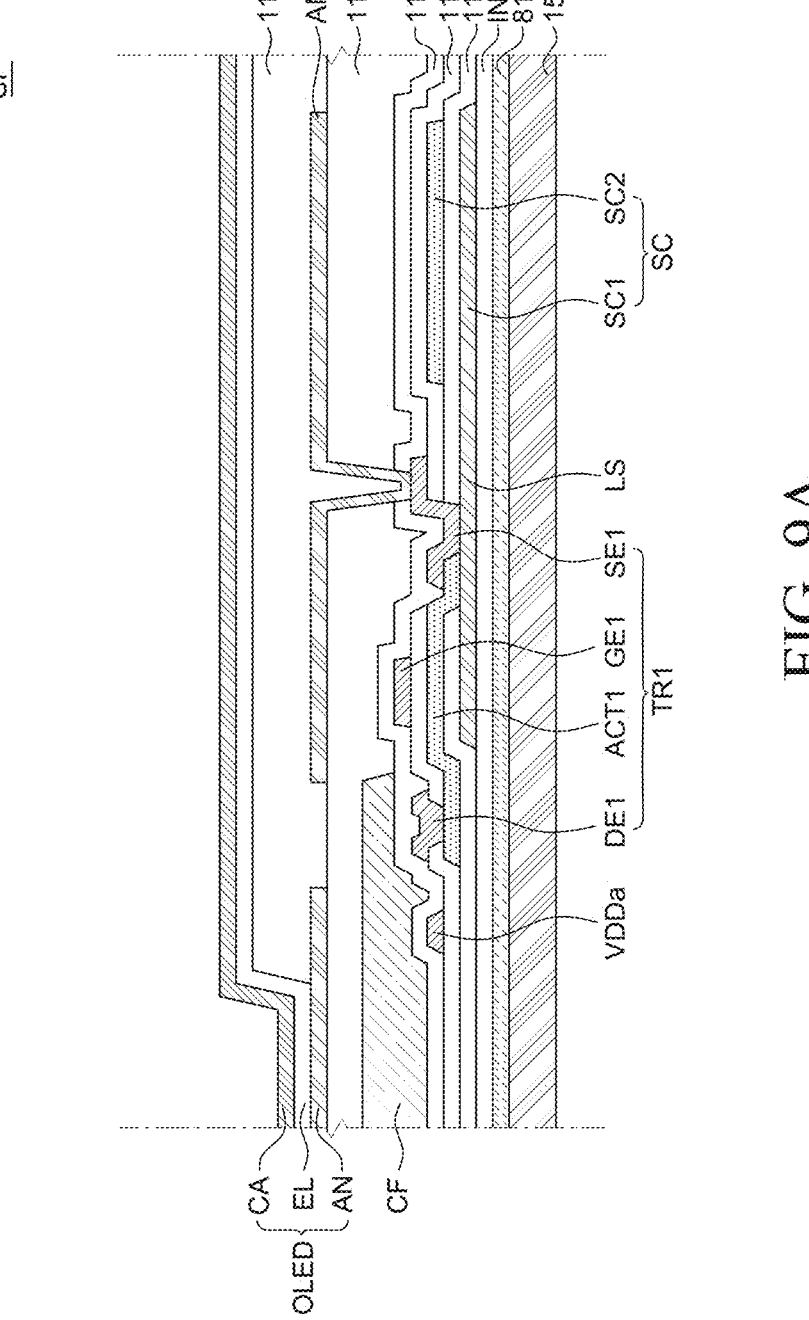
FIGS. 9A to 9C are schematic cross-sectional views of a display device according to another exemplary embodiment of the present disclosure.
Figure 9B:
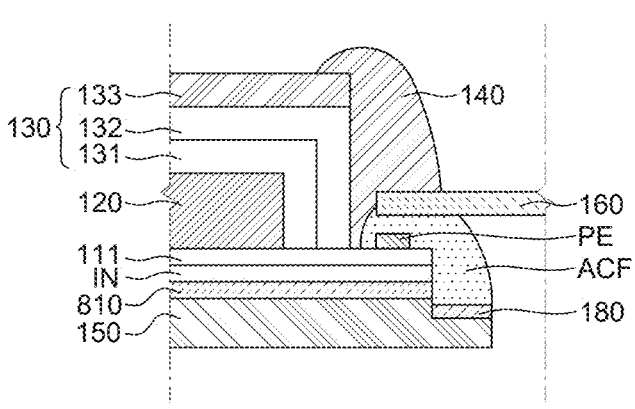
Figure 9C:
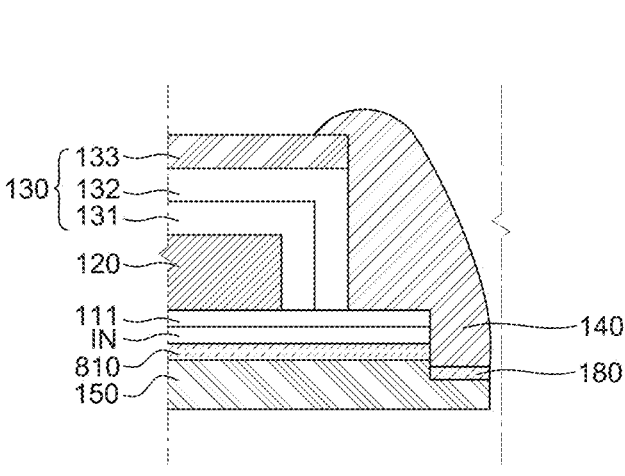

FIG. 8 is a schematic plan view of a display device according to another exemplary embodiment of the present disclosure. FIGS. 9A to 9C are schematic cross-sectional views of a display device according to another exemplary embodiment of the present disclosure. In FIG. 8, for the convenience of description, only a film member 150, a substrate 810, an insulating layer IN, a pixel unit 120, an encapsulation unit 130, and a seal member 140 are illustrated. The only difference between a display device 800 of FIGS. 8 to 9C and the display device 100 of FIGS. 1 to 7B is a substrate 810 and an insulating layer IN which is further included, but other configurations are substantially the same, so that a redundant description will be omitted.

The substrate 810 may be formed of any one of a transparent conducting oxide and an oxide semiconductor. For example, the substrate 810 may be formed of a transparent conducting oxide (TCO), such as indium tin oxide (ITO), indium zinc oxide (IZO), or indium tin zinc oxide (ITZO).

Further, the substrate 810 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the substrate 810 may be formed by another transparent conducting oxide and oxide semiconductor material which have not been described in the specification, but is not limited thereto.

In the meantime, the substrate 810 may be formed by depositing the transparent conducting oxide or an oxide semiconductor with a very thin thickness. Therefore, as the substrate 810 is formed to have a very thin thickness, the substrate may have a flexibility. A display device 800 including a substrate 810 having a flexibility may be implemented as a flexible display device which displays an image even in a folded or rolled state. For example, when the display device 800 is a foldable display device, the substrate 810 may be folded or unfolded with respect to a folding axis. As another example, when the display device 800 is a rollable display device, the display device 800 may be stored by being rolled around the roller. Accordingly, the display device 800 according to another exemplary embodiment of the present disclosure uses a substrate 810 having a flexibility to be implemented as a flexible display device 800 like a foldable display device or a rollable display device.

Further, the display device 800 according to another exemplary embodiment of the present disclosure uses a substrate 810 formed of a transparent conducting oxide or an oxide semiconductor to perform an LLO process. The substrate 810 is a layer for more easily performing the LLO process so that it may be referred to as a functional thin film, a functional thin film layer, or a functional substrate.

Referring to FIGS. 8 to 9C, the insulating layer IN is disposed on the substrate 810. The insulating layer IN may suppress moisture and/or oxygen which penetrates from the outside of the substrate 810 from being spread. The moisture permeation characteristic of the display device 800 may be controlled by controlling a thickness or a lamination structure of the insulating layer IN. Further, the insulating layer IN may suppress a short defect from being caused when the substrate 810 formed of a transparent conducting oxide or an oxide semiconductor is in contact with the other configurations such as the pixel unit 120. The insulating layer IN may be formed of an inorganic material, for example, may be configured by a single layer or a double layer of silicon oxide SiOx and silicon nitride SiNx, but is not limited thereto.

Referring to FIGS. 8 to 9C, the pixel unit 120 is disposed on an insulating layer IN. Specifically, the plurality of high potential power lines VDD, the plurality of data lines DL, the plurality of reference lines RL, and the light shielding layer LS may be disposed on the insulating layer IN.

Referring to FIG. 9B, the anisotropic conductive film ACF may enclose a part of the organic pattern 180 in the pad unit PA. The organic pattern 180 is in contact with the anisotropic conductive film ACF in an area corresponding to the pad unit PA. Specifically, in an area of the pad unit PA in which the anisotropic conductive film ACF is disposed, a part of the organic pattern 180 adjacent to the pad electrode PE may be enclosed by the anisotropic conductive film ACF and may be in contact with the anisotropic conductive film ACF. At this time, the anisotropic conductive film ACF may be in contact with the side surface of the insulating layer IN, the side surface of the substrate 810, and the upper surface of the organic pattern 180.

Referring to FIG. 9C, in the non-pad unit NPA, the organic pattern 180 is in contact with the seal member 140. The seal member 140 is in contact with the organic pattern 180 in an area corresponding to the non-pad unit NPA. The seal member 140 is in contact with the edge of the encapsulation unit 130 and the side surface of the encapsulation unit 130 and also in contact with the upper surface of the buffer layer 111 and the side surface of the substrate 810. The seal member 140 is in contact with the organic pattern 180 disposed below the substrate 810, at an outside of the circumference of the substrate 810 so that the seal member 140 may seal not only the side surface of the encapsulation unit 130, but also side surfaces of the buffer layer 111 and the substrate 810. At this time, the seal member 140 may be in contact with the side surface of the insulating layer IN, the side surface of the substrate 810, and the upper surface of the organic pattern 180.

In the display device 800 according to another exemplary embodiment of the present disclosure, the substrate 810 is formed of any one of a transparent conducting oxide and an oxide semiconductor to reduce a thickness of the display device 800. In the related art, the plastic substrate has been mainly used as the substrate of the display device. However, the plastic substrate is formed by coating and curing a substrate material at a high temperature so that there are problems in that it takes a long time and it is difficult to form the thickness to be lower than a predetermined level. In contrast, the transparent conducting oxide and the oxide semiconductor may be formed to have a very thin thickness by the deposition process such as sputtering. Therefore, in the display device 800 according to another exemplary embodiment of the present disclosure, a substrate 810 which supports various components of the display device 800 is configured by a transparent conducting oxide layer or the oxide semiconductor layer to reduce a thickness of the display device 800 and implement a slim design.

In the display device 800 according to another exemplary embodiment of the present disclosure, the substrate 810 is formed of a transparent conducting oxide or an oxide semiconductor to improve the flexibility of the display device 800 and reduce the stress generated when the display device 800 is deformed. Specifically, when the substrate 810 is configured by the transparent conducting oxide layer or the oxide semiconductor, the substrate 810 may be formed as a very thin film. Accordingly, the display device 800 including a substrate 810 may have a high flexibility and the display device 800 may be easily bent or rolled. Therefore, in the display device 800 according to another exemplary embodiment of the present disclosure, the substrate 810 is formed by any one of the transparent conducting oxide layer and the oxide semiconductor to improve the flexibility of the display device 800. Accordingly, the stress generated when the display device 800 is deformed is also relieved so that the crack caused in the display device 800 may be minimized.

In the display device 800 according to another exemplary embodiment of the present disclosure, the substrate 810 is formed of any one of a transparent conducting oxide layer and an oxide semiconductor layer to reduce the possibility of generating the static electricity in the substrate 810. If the substrate 810 is formed of plastic so that the static electricity is generated, various wiring lines and driving elements on the substrate 810 are damaged or the driving is affected due to the static electricity to degrade the display quality. Instead, when the substrate 810 is formed of the transparent conducting oxide layer or the oxide semiconductor layer, the static electricity generated in the substrate 810 is minimized and a configuration for blocking and discharging the static electricity may be simplified. Accordingly, in the display device 800 according to another exemplary embodiment of the present disclosure, the substrate 810 is formed of any one of the transparent conducting oxide layer or the oxide semiconductor having a low possibility of generating the static electricity. By doing this, the damage or the display quality degradation due to the static electricity may be minimized.

Further, in the display device 800 according to another exemplary embodiment of the present disclosure, the substrate 810 is formed of one of the transparent conducting oxide and the oxide semiconductor to minimize the permeation of the moisture or oxygen of the outside into the display device 800 by means of the substrate 810. When the substrate 810 is formed of the transparent conducting oxide layer or the oxide semiconductor, the substrate 810 is formed in the vacuum environment so that the foreign material generation possibility is significantly low. Further, even though the foreign material is generated, the size of the foreign material is very small so that the permeation of the moisture and oxygen into the display device 800 may be minimized. Accordingly, in the display device 800 according to another exemplary embodiment of the present disclosure, the substrate 810 is formed of a transparent conducting oxide or the oxide semiconductor having a low possibility of generating the foreign materials and an excellent moisture permeation performance. By doing this, the reliability of the light emitting diode OLED including an organic layer and the display device 800 may be improved.

In the display device 800 according to another exemplary embodiment of the present disclosure, the substrate 810 is formed of any one of a transparent conducting oxide and an oxide semiconductor to attach a barrier film which is thin and cheap below the substrate 810. When the substrate 810 is formed of a material having a low moisture permeation performance, for example, plastic, the moisture permeability may be supplemented by attaching a high performance barrier film which is thick and expensive. However, in the display device 800 according to another exemplary embodiment of the present disclosure, the substrate 810 is formed of a transparent conducting oxide or an oxide semiconductor having an excellent moisture permeation performance so that a thin and cheap barrier film may be attached below the substrate 810. Accordingly, in the display device 800 according to another exemplary embodiment of the present disclosure, the substrate 810 is configured by any one of the transparent conducting oxide or the oxide semiconductor having an excellent moisture permeation performance to reduce the manufacturing cost of the display device 800.

In the display device 800 according to another exemplary embodiment of the present disclosure, the substrate 810 is formed of any one of a transparent conducting oxide and an oxide semiconductor to perform an LLO process. When the display device 800 is manufactured, a temporary substrate in which a sacrificial layer is formed is attached below the substrate 810 and then a pixel unit 120 may be formed on the substrate 810. The sacrificial layer may use, for example, a hydrogenated amorphous silicon or an amorphous silicon which is hydrogenated and doped with impurities. After completing the manufacturing of the display device 800, when a laser is irradiated from the lower portion of the temporary substrate, the hydrogen of the sacrificial layer is dehydrogenated and the sacrificial layer and the temporary substrate may be separated from the substrate 810. At this time, the transparent conducting oxide and the oxide semiconductor are materials which may perform the LLO process with the sacrificial layer and the temporary substrate. Therefore, even though the substrate 810 is formed of any one of the transparent conducting oxide or the oxide semiconductor, the substrate 810 may be easily separated from the temporary substrate. Accordingly, in the display device 800 according to another exemplary embodiment of the present disclosure, the substrate 810 is configured by any one of the transparent conducting oxide layer or the oxide semiconductor which may perform the LLO process. Therefore, the display device 800 may be easily manufactured with the existing process and equipment.

In the display device 800 according to another exemplary embodiment of the present disclosure, the organic pattern 180 is disposed at the outside of the edge of the substrate 810 and the anisotropic conductive film ACF and the seal member 140 overflow to be in contact with the organic pattern 180. At this time, the organic pattern 180 is formed of a material which can be decomposed by the laser, so that even though the anisotropic conductive film ACF and the seal member 140 overflow during the manufacturing process, the anisotropic conductive film ACF and the seal member 140 do not flow down to the side surface of the temporary substrate. Therefore, the LLO process is normally performed.

Further, in the display device 800 according to another exemplary embodiment of the present disclosure, the anisotropic conductive film ACF and the seal member 140 overflow so that the anisotropic conductive film ACF and the seal member 140 seal the side surface of the buffer layer 111, the side surface of the insulating layer IN, and the side surface of the substrate 810. Therefore, it is possible to minimize the permeation of moisture or oxygen.

Further, in the display device 800 according to another exemplary embodiment of the present disclosure, the anisotropic conductive film ACF and the seal member 140 overflow so that the anisotropic conductive film ACF and the seal member 140 are covered in an area adjacent to the end above the substrate 810. Therefore, in the display device 800 according to another exemplary embodiment of the present disclosure, the crack of the inorganic layer and the wiring line to be generated when the anisotropic conductive film ACF and the seal member 140 are not disposed in an area adjacent to the end above the substrate 810 may be suppressed. Further, the scattering problem due to the arrangement of foreign materials may be also suppressed.

Figure 10:
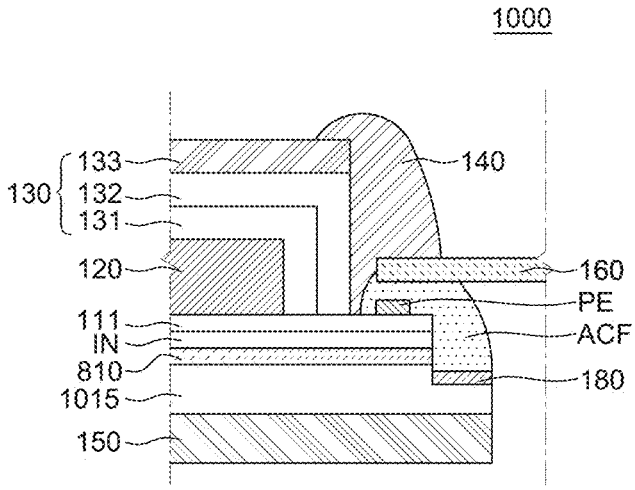
FIG. 10 is a schematic cross-sectional view of a display device according to still another exemplary embodiment of the present disclosure.

FIG. 10 is a schematic cross-sectional view of a display device according to still another exemplary embodiment of the present disclosure. The only difference between a display device 1000 of FIG. 10 and the display device 800 of FIGS. 8 to 9C is a lower planarization seal which is further included, but the other configuration is substantially the same, so that a redundant description will be omitted.

Referring to FIG. 10, a lower planarization seal 1015 is disposed between the substrate 810 and the film member 150. The lower planarization seal 1015 is disposed on the film member 150 and the substrate 810 and the organic pattern 180 are disposed on the lower planarization seal 1015. Therefore, the organic pattern 180 may be disposed above the lower planarization seal 1015. The lower planarization seal 1015 may be formed of, for example, an epoxy or acryl based material, but is not limited thereto.

In the display device 1000 according to still another exemplary embodiment of the present disclosure, the lower planarization seal 1015 is disposed below the substrate 810 and the organic pattern 180 to planarize lower portions of the substrate 810 and the organic pattern 180. That is, when the film member 150 is disposed directly below the organic pattern 180, in an area overlapping the organic pattern 180, the film member 150 may be lifted due to the thickness of the organic pattern 180. Therefore, in the display device 1000 according to another exemplary embodiment of the present disclosure, the lower portions of the substrate 810 and the organic pattern 180 are flattened by the lower planarization seal 1015 so that the film member 150 may be disposed to be flat.

Figure 11:
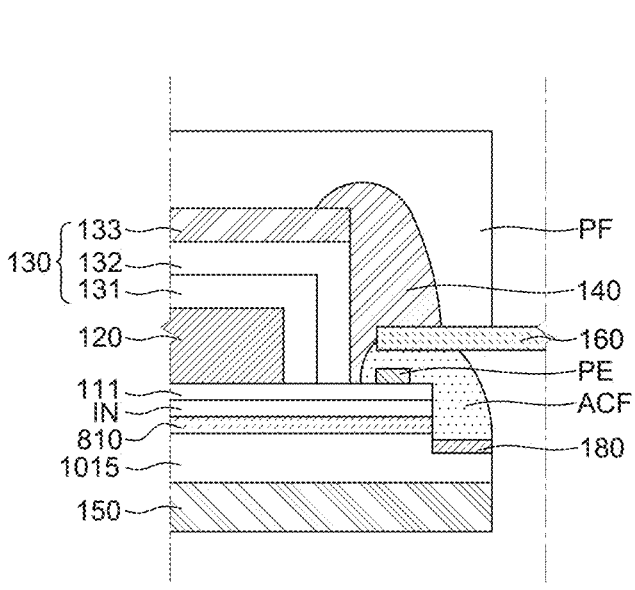
FIG. 11 is a schematic cross-sectional view of a display device according to still another exemplary embodiment of the present disclosure.

FIG. 11 is a schematic cross-sectional view of a display device according to still another exemplary embodiment of the present disclosure. The only difference between a display device 1100 of FIG. 11 and the display device 1000 of FIG. 10 is a protection film PF which is further included, but the other configuration is substantially the same, so that a redundant description will be omitted.

Referring to FIG. 11, the protection film PF is disposed above the encapsulation unit 130 so as to overlap the entire substrate 810. The protection film PF overlaps the entire substrate 810 and may be larger than the substrate 810 in a plane. For example, the protection film PF is formed of polyethylene terephthalate PET, but is not limited thereto.

In the display device 1100 according to still another exemplary embodiment of the present disclosure, the protection film PF is disposed above the encapsulation unit 130 so as to overlap the entire substrate 810 to suppress the curling from being generated in the display device 1100. When the substrate 810 is formed of any one of a transparent conducting oxide and an oxide semiconductor, the thickness of the substrate 810 is significantly reduced as compared with a substrate 810 which uses an organic material. Therefore, when the LLO process is completed, the curling is caused in the display device 1100. Accordingly, in the display device 1100 according to still another exemplary embodiment of the present disclosure, the protection film PF is disposed above the encapsulation unit 130 so as to overlap the entire substrate 810 to suppress the curling generated in the display device 1100 and may fix a shape of the display device 1100.

Figure 12A:
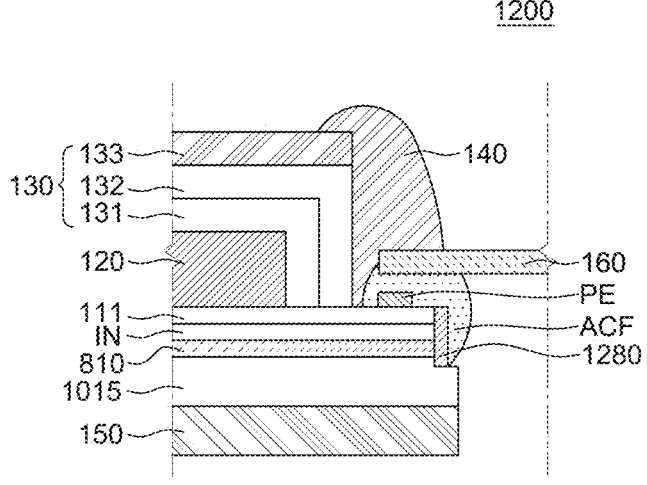
FIGS. 12A and 12B are schematic cross-sectional views of a display device according to still another exemplary embodiment of the present disclosure.
Figure 12B:
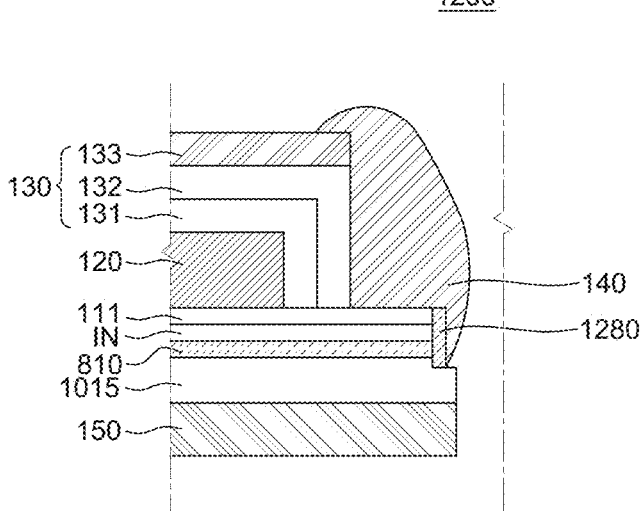

FIGS. 12A and 12B are schematic cross-sectional views of a display device according to still another exemplary embodiment of the present disclosure. The only difference of the display device 1200 of FIGS. 12A and 12B and the display device 1000 of FIG. 10 is an organic pattern 1280 and an anisotropic conductive film ACF, but the other configuration is substantially the same so that a redundant description will be omitted.

Referring to FIG. 12A, the organic pattern 1280 is disposed so as to enclose the insulating layer IN and the substrate 810. That is, the organic pattern 1280 is disposed so as to enclose side surfaces of the insulating layer IN and the substrate 810. Specifically, during the manufacturing process, a sacrificial layer is formed on the temporary substrate, the substrate 810 is formed on the sacrificial layer, the insulating layer IN is formed on the substrate 810, and the other components of the display device 1200 are sequentially formed on the insulating layer IN. Next, prior to a process of applying the anisotropic conductive film ACF, the organic pattern 1280 may be formed on side surfaces of the temporary substrate, the sacrificial layer, the substrate 810, and the insulating layer IN. Next, when the anisotropic conductive film ACF is applied to overflow, the anisotropic conductive film ACF may be in contact with the side surface of the organic pattern 1280. As described above, when the LLO process is performed while the anisotropic conductive film ACF overflows, the organic pattern 1280 which is in contact with the anisotropic conductive film ACF remains, but the organic pattern 1280 which is not in contact with the anisotropic conductive film ACF may be removed. Even though in FIG. 12A, it is illustrated that ends of the organic pattern 1280 and the anisotropic conductive film ACF are disposed below the substrate 810, positions of the ends of the organic pattern 1280 and the anisotropic conductive film ACF may be changed depending on how much the anisotropic conductive film ACF is applied. However, when the anisotropic conductive film ACF and the organic pattern 1280 are disposed so as to enclose the side surfaces of the insulating layer IN and the substrate 810, it is advantageous in terms of the reliability such as suppression of the moisture permeation. Therefore, it is advantageous to manufacture the ends of the organic pattern 1280 and the anisotropic conductive film ACF to be disposed below the substrate 810.

Referring to FIG. 12B, the organic pattern 1280 is disposed so as to enclose the insulating layer IN and the substrate 810 also in a position where the flexible film 160 is not disposed. That is, the organic pattern 1280 is disposed so as to enclose side surfaces of the insulating layer IN and the substrate 810. Specifically, during the manufacturing process, a sacrificial layer is formed on the temporary substrate, the substrate 810 is formed on the sacrificial layer, the insulating layer IN is formed on the substrate 810, and the other components of the display device 1200 are sequentially formed on the insulating layer IN. Next, prior to a process of applying the seal member 140, the organic pattern 1280 may be formed on side surfaces of the temporary substrate, the sacrificial layer, the substrate 810, and the insulating layer IN. Next, the seal member 140 is applied to overflow, the seal member 140 is disposed to enclose the other part of the side surface of the organic pattern 1280 which is not in contact with the anisotropic conductive film ACF to be in contact therewith. As described above, when the LLO process is performed while the seal member 140 overflows, the organic pattern 1280 which is in contact with the seal member 140 remains, but the organic pattern 1280 which is not in contact with the seal member 140 may be removed. Even though in FIG. 12B, it is illustrated that ends of the organic pattern 1280 and the seal member 140 are disposed below the substrate 810, positions of the ends of the organic pattern 1280 and the seal member 140 may be changed depending on how much the seal member 140 is applied. However, when the seal member 140 and the organic pattern 1280 are disposed so as to enclose the side surfaces of the insulating layer IN and the substrate 810, it is advantageous in terms of the reliability such as suppression of the moisture permeation. Therefore, it is advantageous to manufacture the ends of the organic pattern 1280 and the seal member 140 to be disposed below the substrate 810.

In the display device 1200 according to still another exemplary embodiment of the present disclosure, the organic pattern 1280 is disposed so as to enclose the side surfaces of the insulating layer IN and the substrate 810 and the anisotropic conductive film ACF and the seal member 140 overflow to be in contact with the organic pattern 1280. At this time, the organic pattern 1280 is formed of a material which can be decomposed by the laser so that the LLO process may be performed on the organic pattern 1280. Accordingly, in the display device 1200 according to still another exemplary embodiment of the present disclosure, even though the anisotropic conductive film ACF and the seal member 140 overflow during the manufacturing process, the anisotropic conductive film ACF and the seal member 140 are not in contact with the temporary substrate. Therefore, the LLO process may be normally performed.

Further, in the display device 1200 according to still another exemplary embodiment of the present disclosure, the anisotropic conductive film ACF and the seal member 140 overflow. Accordingly, the anisotropic conductive film ACF and the seal member 140 may seal the side surface of the buffer layer 111, the side surface of the insulating layer IN, and the side surface of the substrate 810. Accordingly, the permeation of moisture or oxygen through the side surface of the buffer layer 111, the side surface of the insulating layer IN, or the side surface of the substrate 810 may be minimized.

Further, in the display device 1200 according to still another exemplary embodiment of the present disclosure, the anisotropic conductive film ACF and the seal member 140 overflow so that the anisotropic conductive film ACF and the seal member 140 are covered in an area adjacent to the end above the substrate 810. Therefore, in the display device 1200 according to still another exemplary embodiment of the present disclosure, the crack of the inorganic layer and the wiring line to be generated when the anisotropic conductive film ACF and the seal member 140 are not disposed in an area adjacent to the end above the substrate 810 may be suppressed. Further, the scattering problem due to the arrangement of foreign materials may also suppressed.

In the display device 1200 according to still another exemplary embodiment of the present disclosure, the LLO process may be performed without any problem and the size of the non-active area NA may be reduced. In the display device 1200 according to still another exemplary embodiment of the present disclosure, the organic pattern 1280 is not disposed on the same plane as the sacrificial layer during the manufacturing process, but may be disposed so as to enclose the side surfaces of the insulating layer IN and the substrate 810. When the organic pattern 1280 protrudes outwardly on the same plane as the sacrificial layer, the non-active area NA may be increased as much as the corresponding area. Therefore, there may be a problem in that in order to reduce the increased non-active area NA, an additionally process, such as laser cutting, needs to be performed on the corresponding area. Accordingly, in the display device 1200 according to still another exemplary embodiment of the present disclosure, the organic pattern 1280 is disposed to be in contact with the side surfaces of the insulating layer IN and the substrate 810. Accordingly, an amount of the anisotropic conductive film ACF or the seal member 140 which protrude outwardly from the substrate 810 after the LLO process is reduced so that the non-active area NA may be reduced without performing the additional process.

FIGS. 13A to 13D are cross-sectional views schematically illustrating a manufacturing method of a display device according to another exemplary embodiment of the present disclosure. FIGS. 13A to 13D are cross-sectional views for explaining a manufacturing method of the display device 800 of FIGS. 8 to 9C.

Figure 13A:
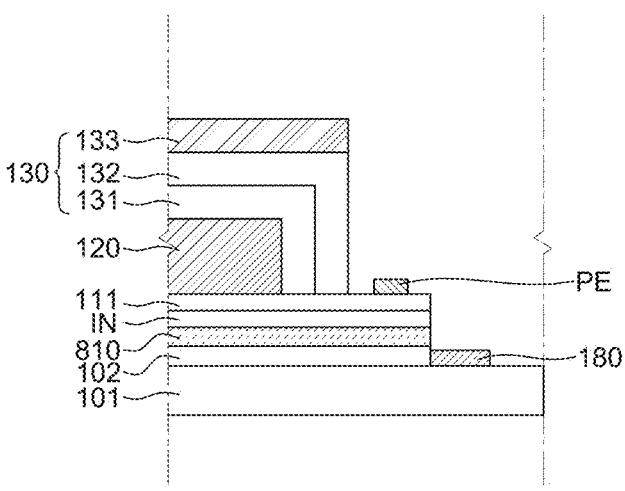

First, referring to FIG. 13A, the sacrificial layer 102 is formed on the temporary substrate 101 and the substrate 810, the insulting layer IN, the buffer layer 111, the pad electrode PE, the pixel unit 120, and the encapsulation unit 130 are sequentially formed on the sacrificial layer 102. Next, the organic pattern 180 is formed. The organic pattern 180 is disposed on the temporary substrate 101 which protrudes outwardly from the substrate 110 and the sacrificial layer 102. Therefore, the organic pattern 180 may be disposed so as to enclose the sacrificial layer 102. At this time, the upper surface of the organic pattern 180 may be lower than the upper surface of the sacrificial layer 102.

Figure 13B:
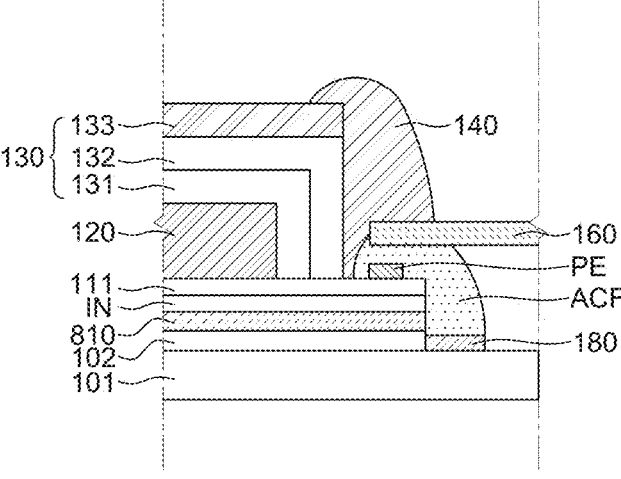

Next, referring to FIG. 13B, the anisotropic conductive film ACF is disposed in a state in which the organic pattern 180 is disposed. The anisotropic conductive film ACF overflows to be in contact with the upper surface of the organic pattern 180. Next, the flexible film 160 is disposed to be electrically connected to the pad electrode PE and the seal member 140 may be also disposed.

Figure 13C:
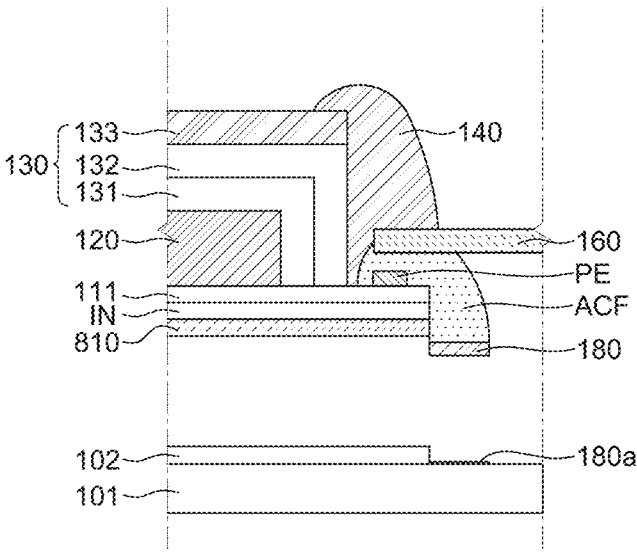

Next, referring to FIG. 13C, the LLO process is performed. After irradiating the laser from the lower portion of the temporary substrate 101, when the temporary substrate 101 is separated, the sacrificial layer 102 and a remaining organic pattern film 180a are removed together with the temporary substrate 101 and the organic pattern 180 may remain together with the anisotropic conductive film ACF.

At this time, the organic pattern 180 may have a weak surface bonding force by the laser due to the principle of photolysis, thermal decomposition, and light absorption.

First, when a laser, for example, UV laser is irradiated onto the organic pattern 180, photooxidation may occur due to electron transfer of the organic material. In most of these reactions, electrons are transited to an excited state, and radical ions are continuously generated together with oxygen (O2) in the steady state. Based on this principle, when the laser is irradiated onto the organic pattern 180, the photolysis is generated so that the surface bonding force of the organic pattern 180 may be weakened.

Further, when the laser is irradiated onto the organic pattern 180, thermal decomposition may occur in the organic pattern 180 due to the low melting point and boiling point of the organic material which configures the organic pattern 180. For example, when the laser is irradiated onto the organic pattern 180, the surface temperature rises to approximately 200 degrees and the organic pattern 180 is thermally decomposed due to the high surface temperature so that the surface bonding force of the organic pattern 180 may be weakened.

Further, as described above, when a pigment is added to the organic pattern 180, the organic pattern 180 absorbs light to accelerate the reaction.

For example, when the organic pattern 180 is formed of a toluene based material, if the laser is irradiated onto the organic pattern 180, "—CH3" is decomposed by laser and heat generated by the laser. Therefore, hydrogen (H2), carbon monoxide (CO), and carbon dioxide (CO2) may be generated to weaken the surface bonding force of the organic pattern 180. For example, when the organic pattern 180 is formed of a xylene based material, if the laser is irradiated onto the organic pattern 180, "—H" and "OH" are decomposed by laser and heat generated by the laser. Therefore, hydrogen (H2) and water (H2O) may be generated to weaken the surface bonding force of the organic pattern 180. However, the anisotropic conductive film ACF and the seal member 140 are formed of an organic material, but the temporary substrate 101 is formed of an inorganic material such as glass so that only a very thin remaining organic pattern film 180a remains in the temporary substrate 101. However, the organic pattern 180 attached to the anisotropic conductive film ACF and the seal member 140 remains in the final product with a relatively large thickness.

Figure 13D:
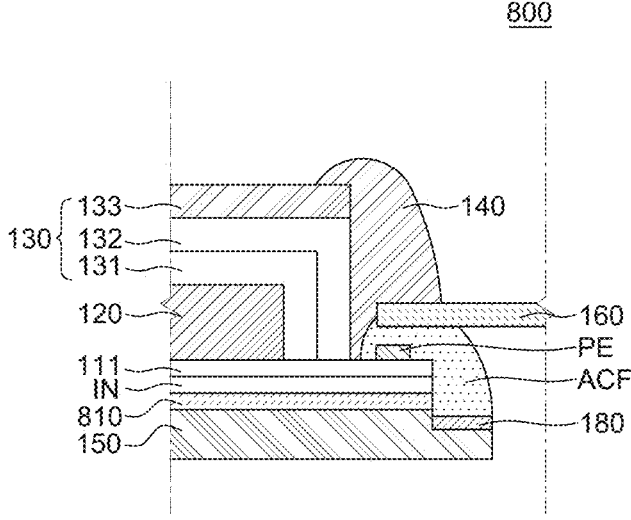

Next, referring to FIG. 13D, a film member 150 may be disposed below the substrate 810 and the organic pattern 180.

In the manufacturing method of the display device 800 according to another exemplary embodiment of the present disclosure, the organic pattern 180 is disposed at the outside of the edge of the substrate 810 and the anisotropic conductive film ACF overflows to be in contact with the organic pattern 180. At this time, the organic pattern 180 is formed of a material which can be decomposed by the laser, so that even though the anisotropic conductive film ACF overflows during the manufacturing process, the anisotropic conductive film ACF does not flow down to the side surface of the temporary substrate. Therefore, the LLO process may be normally performed.

The exemplary embodiments of the present disclosure can also be described as follows:

According to an aspect of the present disclosure, there is provided a display device. The display device includes a substrate including an active area in which a plurality of pixels is defined, a pad unit which is disposed at an outer periphery of the active area and includes a plurality of pad electrodes, and a non-active area which includes a non-pad unit excluding the pad unit, an insulating layer on the substrate, a pixel unit on the insulating layer, an encapsulation unit on the pixel unit, a film member which is disposed below the substrate and protrudes outwardly from the substrate, an organic pattern which is disposed at an edge of the film member protruding outwardly from the substrate, an anisotropic conductive film which is disposed on the plurality of pad electrodes, a side surface of the insulating layer, and a side surface of the substrate and a flexible film which is disposed on the plurality of pad electrodes to be electrically connected to the plurality of pad electrodes by means of the anisotropic conductive film, wherein the organic pattern is in contact with the anisotropic conductive film in an area corresponding to the pad unit.

The display device may further include a seal member disposed in the non-active area, wherein the seal member is in contact with the organic pattern in an area corresponding to the non-pad unit.

The anisotropic conductive film may be contact with a side surface of the insulating layer and an upper surface of the organic pattern and the upper surface of the organic pattern may be disposed to be lower than the upper surface of the substrate.

The organic pattern may be disposed so as to enclose the insulating layer and the substrate and the anisotropic conductive film may be disposed so as to enclose a part of the organic pattern.

The organic pattern may be in contact with the side surface of the insulating layer and the side surface of the substrate and the anisotropic conductive film may be in contact with a part of the side surface of the organic pattern.

The seal member may be disposed so as to enclose the other part of the organic pattern.

The seal member may be in contact with the other part of the side surface of the organic pattern.

The substrate may be formed of one of a conductive oxide layer and an oxide semiconductor.

The display device may further include a planarization seal disposed between the substrate and the film member.

The organic pattern may be disposed above the planarization seal.

The display device may further include a protection film disposed above the encapsulation unit so as to overlap the entire substrate.

The organic pattern may be formed of a material which is capable of being decomposed by laser.

The organic pattern may include at least one from a group consisting of xylene, toluene, ethyl acetate, terpene, and turpentine.

The organic pattern may include a pigment.

The film member may include at least one of a polarizing plate and a barrier film.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including an active area in which a plurality of pixels is defined, and a non-active area which is disposed at an outer periphery of the active area, wherein the non-active area includes a pad unit in which a plurality of pad electrodes are disposed and a non-pad unit excluding the pad unit;
   an insulating layer on the substrate;
   a pixel unit on the insulating layer;
   an encapsulation unit on the pixel unit;
   a film member which is disposed below the substrate and protrudes outwardly from the substrate;
   an organic pattern which is disposed at an edge of the film member protruding outwardly from the substrate;
   an anisotropic conductive film which is disposed on the plurality of pad electrodes, a side surface of the insulating layer, and a side surface of the substrate; and
   a flexible film which is disposed on the plurality of pad electrodes to be electrically connected to the plurality of pad electrodes by means of the anisotropic conductive film,
   wherein the organic pattern is in contact with the anisotropic conductive film in an area corresponding to the pad unit, and
   wherein the organic pattern is disposed to enclose the substrate.

2. The display device according to claim 1, further comprising:
   a seal member disposed in the non-active area,
   wherein the seal member is in contact with the organic pattern in an area corresponding to the non-pad unit.

3. The display device according to claim 2, wherein the anisotropic conductive film is in contact with a side surface of the insulating layer and an upper surface of the organic pattern and the upper surface of the organic pattern is disposed to be lower than the upper surface of the substrate.

4. The display device according to claim 2, wherein the organic pattern is disposed so as to enclose the insulating layer and the substrate and the anisotropic conductive film is disposed so as to enclose a part of the organic pattern.

5. The display device according to claim 4, wherein the organic pattern is in contact with the side surface of the insulating layer and the side surface of the substrate and the anisotropic conductive film is in contact with a part of the side surface of the organic pattern.

6. The display device according to claim 4, wherein the seal member is disposed so as to enclose the other part of the organic pattern.

7. The display device according to claim 6, wherein the seal member is in contact with the other part of the side surface of the organic pattern.

8. The display device according to claim 1, wherein the substrate is formed of one of a conductive oxide layer and an oxide semiconductor.

9. The display device according to claim 8, further comprising:

a lower planarization seal disposed between the substrate and the film member.

10. The display device according to claim 9, wherein the organic pattern is disposed above the lower planarization seal.

11. The display device according to claim 8, further comprising:

a protection film disposed above the encapsulation unit so as to overlap the entire substrate.

12. The display device according to claim 1, wherein the organic pattern is formed of a material which is capable of being decomposed by laser.

13. The display device according to claim 12, wherein the organic pattern includes at least one from a group consisting of xylene, toluene, ethyl acetate, terpene, and turpentine.

14. The display device according to claim 12, wherein the organic pattern includes a pigment.

15. The display device according to claim 1, wherein the film member includes at least one of a polarizing plate and a barrier film.

16. A display device, comprising:

a substrate including an active area in which a plurality of pixels is defined and a non-active area which is disposed at an outer periphery of the active area, wherein the non-active area includes a pad unit in which a plurality of pad electrodes are disposed and a non-pad unit excluding the pad unit;

a pixel unit on the substrate;

an encapsulation unit on the pixel unit;

a seal member disposed in the non-active area and disposed to enclose side surfaces of the pixel unit and the encapsulation unit;

a film member which is disposed below the substrate and protrudes outwardly from the substrate;

an organic pattern which is disposed at an edge of the film member protruding outwardly from the substrate;

an anisotropic conductive film which is disposed on the plurality of pad electrodes and a side surface of the substrate; and a flexible film which is disposed on the plurality of pad electrodes to be electrically connected to the plurality of pad electrodes by means of the anisotropic conductive film, wherein the organic pattern is in contact with the anisotropic conductive film in an area corresponding to the pad unit, and wherein the organic pattern is disposed to enclose the substrate.

* * * * *